(12) United States Patent
Coonen

(10) Patent No.: US 12,015,373 B1
(45) Date of Patent: Jun. 18, 2024

(54) WINDOW UNIT FOR A BUILDING OR STRUCTURE

(71) Applicant: CLEARVUE TECHNOLOGIES LTD, West Perth (AU)

(72) Inventor: Steven Coonen, Grass Valley, CA (US)

(73) Assignee: CLEARVUE TECHNOLOGIES LTD, West Perth (AU)

( * ) Notice: Subject to any disclaimer, the term of this patent is extended or adjusted under 35 U.S.C. 154(b) by 0 days.

(21) Appl. No.: 18/167,291

(22) Filed: Feb. 10, 2023

Related U.S. Application Data

(60) Provisional application No. 63/476,840, filed on Dec. 22, 2022.

(51) Int. Cl.
| | |
|---|---|
| *H02S 20/26* | (2014.01) |
| *E06B 3/67* | (2006.01) |
| *E06B 9/24* | (2006.01) |
| *H01L 31/0468* | (2014.01) |
| *G02F 1/153* | (2006.01) |

(52) U.S. Cl.
CPC ............ *H02S 20/26* (2014.12); *E06B 3/6722* (2013.01); *E06B 9/24* (2013.01); *H01L 31/0468* (2014.12); *E06B 2009/2464* (2013.01); *E06B 2009/2476* (2013.01); *G02F 1/1533* (2013.01)

(58) Field of Classification Search
CPC .............................. H01L 31/0684; H02S 20/26
See application file for complete search history.

(56) References Cited

U.S. PATENT DOCUMENTS

| | | | | |
|---|---|---|---|---|
| 5,149,351 | A | * 9/1992 | Yaba | .................. B32B 17/10036 |
| | | | | 257/E27.125 |
| 2003/0010378 | A1 | 1/2003 | Yoda | |
| 2004/0182432 | A1* | 9/2004 | Yoda | ................... H01L 31/0488 |
| | | | | 136/251 |

(Continued)

FOREIGN PATENT DOCUMENTS

| | | |
|---|---|---|
| CN | 2703068 | 6/2005 |
| CN | 103855233 | 6/2014 |

(Continued)

OTHER PUBLICATIONS

Machine translation of DE102019124375A1 (Year: 2021).*
Machine translation of KR10-1317868B1 (Year: 2013).*
Machine translation of KR10-2486560B1 (Year: 2023).*

*Primary Examiner* — Ryan S Cannon
(74) *Attorney, Agent, or Firm* — Heslin Rothenberg Farley & Mesiti P.C.; Jacquelyn A. Graff, Esq.

(57) ABSTRACT

A window unit for a building or structure comprises a first panel and a second panel each having an area transparent for at least a portion of visible light and a spacer spacing the first panel from the second panel. The spacer surrounds a space between the first and second panels. A first edge area of the first panel extends beyond a projection of the circumference of the spacer in a direction of a surface normal of the first panel. The window unit also comprises a housing incorporating at least one electric or electronic element which is indirectly or directly electrically coupled to at least one other electrical component positioned within the window unit. The housing is positioned at or near the spacer and at least partially within a projection of the circumference of the first edge area of the first panel in the direction of the surface normal of the first panel.

16 Claims, 4 Drawing Sheets

(56) References Cited

U.S. PATENT DOCUMENTS

| | | | |
|---|---|---|---|
| 2008/0276928 A1 | 11/2008 | Young | |
| 2013/0008482 A1* | 1/2013 | Stancel | H01L 31/048 |
| | | | 136/244 |
| 2013/0081338 A1* | 4/2013 | Sagdic | H01R 43/20 |
| | | | 52/173.3 |
| 2016/0225931 A1* | 8/2016 | Heng | H01L 31/0725 |
| 2016/0315209 A1* | 10/2016 | Wang | H02S 40/34 |
| 2019/0024445 A1 | 1/2019 | Chorine et al. | |
| 2019/0036480 A1* | 1/2019 | Barr | H02S 30/10 |
| 2021/0246714 A1 | 8/2021 | Neander et al. | |
| 2021/0265942 A1* | 8/2021 | Lyford | E06B 7/28 |

FOREIGN PATENT DOCUMENTS

| | | | |
|---|---|---|---|
| CN | 210273959 | 4/2020 | |
| DE | 102019124375 A1 * | 3/2021 | |
| EP | 0746044 | 12/1996 | |
| EP | 3348737 A1 * | 7/2018 | E04D 13/035 |
| EP | 3713080 | 9/2020 | |
| KR | 1317868 B1 * | 10/2013 | |
| KR | 20200006161 | 1/2020 | |
| KR | 2486560 B1 * | 1/2023 | |
| WO | 2013003890 | 1/2013 | |
| WO | 2013003894 | 1/2013 | |
| WO | 2015024046 | 2/2015 | |
| WO | 2019017393 | 1/2019 | |

\* cited by examiner

WINDOW UNIT FOR A BUILDING OR STRUCTURE

CROSS-REFERENCE TO RELATED APPLICATIONS

This application claims priority benefit under 35 U.S. C. § 119 (e) of U.S. Provisional Application No. 63/476,840, filed Dec. 22, 2022, and entitled "A Window Unit for a Building or Structure," which is incorporated herein by reference in its entirety.

FIELD OF THE INVENTION

The present disclosure relates to a window unit for a building or structure and relates particularly to a window unit comprising electronic and/or electric components such as solar cells.

BACKGROUND OF THE INVENTION

Buildings such as office towers, high-rise housings and hotels use large amounts of exterior window paneling and/or facades which incorporate glass paneling.

Such glass paneling receives large amounts of sunlight, which results in heating of interior spaces requiring the use of air conditioners. A large amount of energy is globally used to operate air conditioners.

PCT international applications numbers PCT/AU2012/000778, PCT/AU2012/000787 and PCT/AU2014/000814 (owned by the present applicant) disclose window units having a windowpane which is transmissive for visible light, but comprise solar cells that absorb light, such as infrared radiation, to generate electricity.

Further, windows of buildings may comprise other electrical components such as components regulating the transmission of light which often require control electronics. Positioning control electronics and providing electrical connections to such electrical components can be challenging.

The present invention provides technological improvement.

SUMMARY OF THE INVENTION

The present invention provides in a first aspect a window unit for a building or structure, the window unit comprising:
 a first panel having an area transparent for at least a portion of visible light;
 a second panel having an area transparent for at least a portion of visible light;
 a spacer spacing the first panel from the second panel, the spacer surrounding a space between the first and second panels, a first edge area of the first panel extending beyond a projection of the circumference of the spacer in a direction of a surface normal of the first panel; and
 a housing incorporating at least one electric or electronic element which is indirectly or directly electrically coupled to at least one other electrical component positioned within the window unit;
 wherein the housing is positioned at or near, the spacer and at least partially within a projection of the circumference of the first edge area of the first panel in the direction of the surface normal of the first panel.

The housing may be positioned entirely within the projection of the first edge area of the first panel in the direction of the surface normal of the first panel, which facilitates use of the window unit as an Insulated Glass Unit (IGU) having standard dimension and installation requirements.

The second panel may have substantially the same extension as the first panel and a recess may be formed between the first edge area, the spacer and an edge area of the second panel. The housing may be positioned at least largely or entirely within the recess and may be at least largely embedded in butyl or the like. The window unit may have a "flush" edge portion, which further facilitates use of the window unit as an Insulated Glass Unit (IGU) having standard dimension and installation requirements.

The window unit may comprise the other electrical component. The other electrical component may for example be located at a surface of the first or second panel.

In one embodiment the other electrical component is provided in the form of at least one series of solar cells positioned along at least one edge of the first panel.

The electrical element incorporated in the housing may for example comprise diodes and a battery or a capacitor arrangement for storing electricity generated by the at least one series of solar cells. Further, the electrical element incorporated in the housing may comprise control electronics for controlling electrical components of the window unit. The electrical element may also comprise, or may be provided in the form of, an electric lead and may or may not comprise further electric or electronic components. The electrical element may further comprise electronic components such as a battery charge controller, a voltage regulator and further controller that control a function of the window unit.

The window unit may comprise a first electrical coupling for coupling the other electrical component (such as at least one series of solar cells) to the electrical element incorporated within the housing. The first electrical coupling may for example comprise electrical leads. Further, the window unit may comprise a second electrical coupling for coupling the electrical element to at least one other electrical component outside the widow unit. The second electrical coupling may comprise pins or sockets. The second electrical coupling may also comprise a wireless connection, such as a WIFI or Bluetooth connection or the like.

The first panel may comprise first and second component panel portions which are bonded together in a manner such that an airgap between the first and second component panel portions is avoided. At least one series of solar cells may be positioned between the first and second component panels. The first and second panels may be bonded together such that a laminated structure is formed. An adhesive may be used for bonding. In one embodiment the adhesive has a refractive index that at least approximates that of a material of the first and/or second component panel portions, which may for example be glass or a suitable polymeric material.

The window unit may comprise the at least one series of solar cells and the first and second component panel portions may sandwich the at least one series. Bonding of the first and second component panel portions sandwiching the at least one series of solar cells may be achieved using polyvinylbutyral (PVB). The at least one series of solar cells and may be positioned between sheets of PVB. In this embodiment bonding may be performed as follows. Initially a sheet of PVB may be positioned between the first component panel portion and at least one series of solar cells. Bonding of the at least one series of solar cells to the first component panel portion may be effected by applying heat to the sheet of the PVB material. An additional sheet of the PVB material may be positioned over the at least one series of solar cells and the spacer. Further (thicker) PVB sheets may be positioned on areas of the first component panel portion at which no solar cells and no spacer is positioned. The second component panel portion may then be positioned on exposed surfaces of the PVB sheet(s) and may be bonded to the exposed surfaces of the PVB sheet by the application of further heat such that a laminated structure is formed and the solar cells with are sandwiched between the first and second component panel portions.

The first coupling element of the housing may comprise electrical leads, such as substantially flat wires or ribbons, which electrically contact the at least one series of solar cells. Portions of the substantially flat wires or ribbons may be directed through or into the PVB material between the first and second component panel portions towards the at least one series of solar cells.

The spacer may be part of spacer structure comprising corner spacer portions and elongated side portions.

The window unit may also comprise at least one of a suspended particle device, an electrochromic coating, an electro fluidic material, a liquid crystal device, a polymer-dispersed liquid crystal (PDLC) material and an electrophoretic material. The electric and electronic component may comprise a controller for controlling the at least one of a suspended particle device, an electrochromic coating, an electro fluidic material, a liquid crystal device or and polymer-dispersed liquid crystal (PDLC) material and a electrophoretic material.

The first component panel portion may have a first major surface which is parallel to a first major surface of the second component panel portion, the first major surface of the second panel may have a surface area smaller than an area of the first major surface of the first component panel portion whereby the first and second component panel portions are arranged such that a projection of the first component panel portion along a surface normal of the first component panel portion extends beyond a circumference of the second component panel portion. The first major surface of the second component panel portion may face the spacer and electrical leads electrically connecting the at least one series of solar cells to the electrical element incorporated in the housing may be directed around an edge of the second component panel portion. As the edge of the first component panel portion projects beyond the edge of the second component panel portion, the electrical leads are protected. The electrical leads may be embedded in the layer of butyl or the like forming the primary seal of the window unit.

In one embodiment the window unit is a self-powered unit that does not necessarily require external wiring. In this embodiment the window unit may for example comprise blinds or other electrical components which are powered using electricity generated by the at least one series of solar cells.

The at least one series of solar cells may comprise bifacial solar cells having opposite first and second surfaces, each having an area in which light can be absorbed to generate electricity, the solar cells being positioned such that in use the first surfaces are oriented to receive light from the light incident direction and the second surfaces receive light from an opposite direction. The solar cells of the at least one series of solar cells may be positioned in an overlapping relationship, such as in a shingle-like arrangement.

The present invention provides in a second aspect a window unit for a building or structure, the window unit comprising:
a first panel having an area transparent for at least a portion of visible light;
a second panel having an area transparent for at least a portion of visible light;
a housing incorporating at least one electric or electronic element and indirectly or directly electrically coupled to at least one other electrical component;
wherein a first edge area of the first panel extends beyond a projection of the circumference of the second panel in a direction of a surface normal of the first panel; and
wherein the housing is positioned at least partially within a projection of the first edge area of the first panel in the direction of the surface normal of the first panel.

The first and second panels may be bonded together in a manner such that an airgap between the first and second panels is avoided. At least one series of solar cells may be positioned between the first and second component panels. The first and second panels may be bonded together such that a laminated structure is formed.

A portion of the second panel may be positioned between the housing and the first panel.

The window unit may further comprise a third panel and a spacer spacing the third panel from the second panel.

The housing may be separate from the spacer and may be positioned spaced apart but adjacent to the spacer.

The invention will be more fully understood from the following description of specific embodiments of the invention. The description is provided with reference to the accompanying drawings.

DETAILED DESCRIPTION OF EMBODIMENTS

Figure 1:
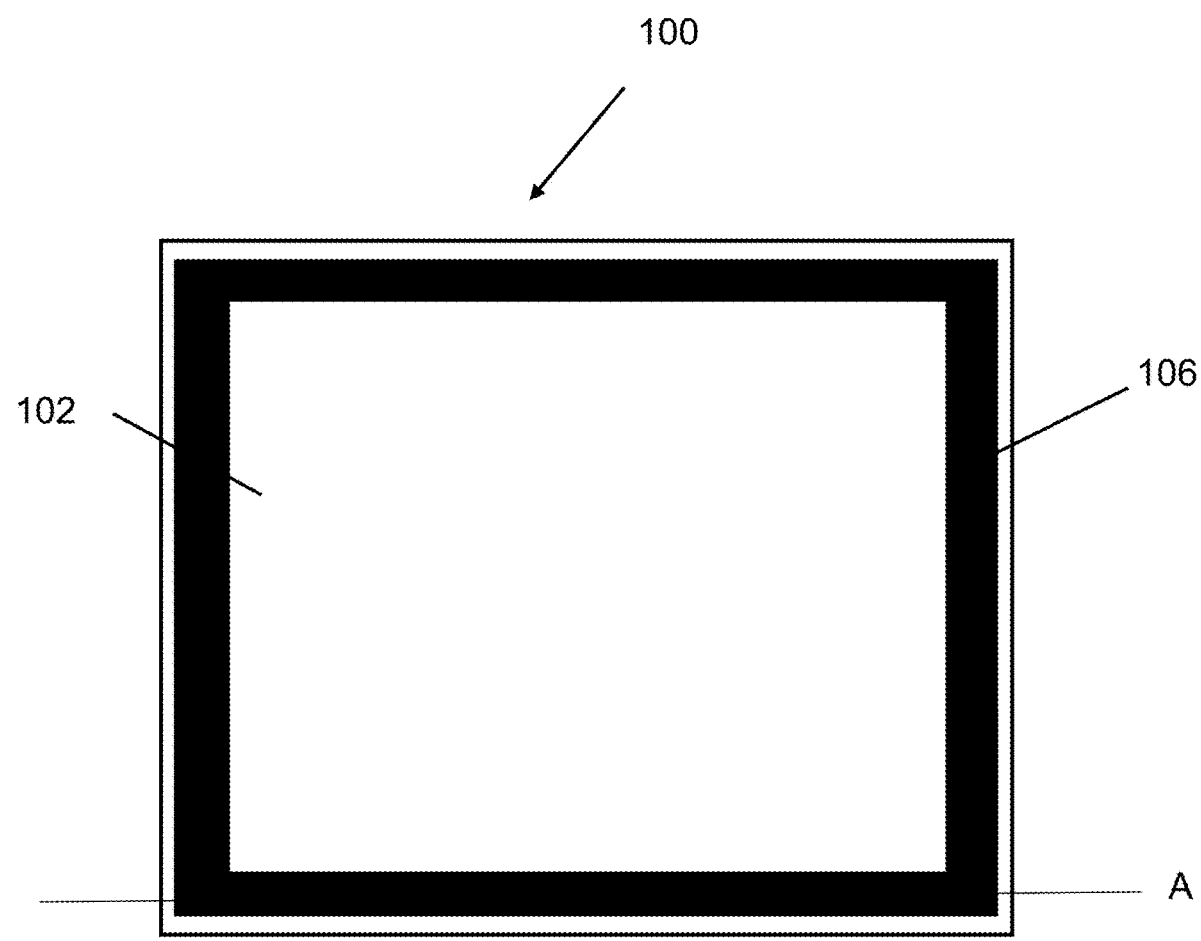
FIG. 1 is a schematic top view of a component of a window unit in accordance with an embodiment of the present invention.

Referring initially to FIG. 1, a window unit according to an embodiment of the present invention is now described. The window unit 100 may for example be provided in the form of a window of a building, a sky light, a window of a car or any other structure that usually comprises windows.

The window unit 100 comprises a first panel 102 spaced apart from a second panel (not shown) by a spacer (also not shown). The first panel 102 and the second panel are transmissive for visible light. The window unit 100 also comprises series of solar cells 106. The window unit 100 may be provided in the form of an Insulated Glass Unit (IGU) and may comprise a frame (not shown).

The window unit 100 comprises a housing for incorporating electrical or electronic components. The housing will be described below with reference to FIGS. 2 to 6. The window unit 100 in accordance with embodiments comprises electric and electronic components required for operation and control of the devices. The electric and electronic components are located in the housing 116, which also comprises external electric couplings and feedthroughs.

The window unit 100 may comprise further devices, which may be operated using electricity generated by the solar cells 106. For example, the window unit 100 may incorporate devices or systems such as a blind, curtain, air damper, fan, sensors, electrochromic layer, motor, or pump.

Figure 2:
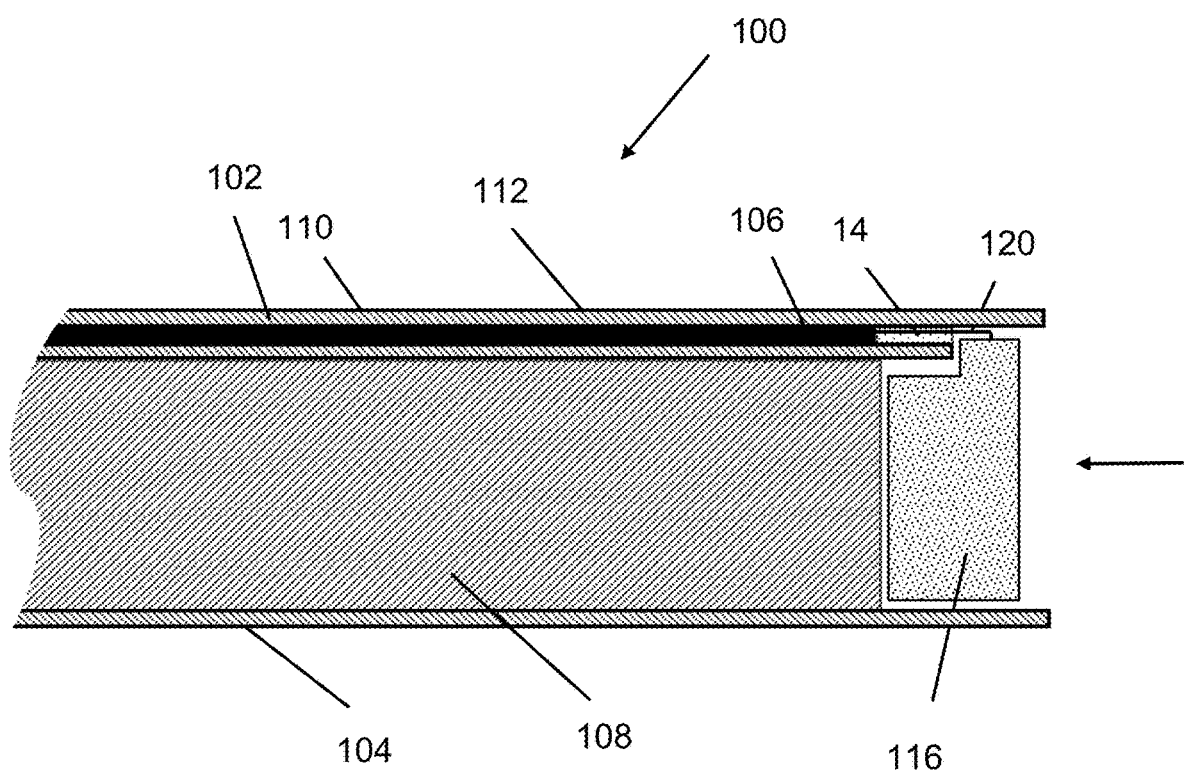
FIG. 2 is a schematic view of the cross-section through plane A indicated in FIG. 1.
Figure 3:
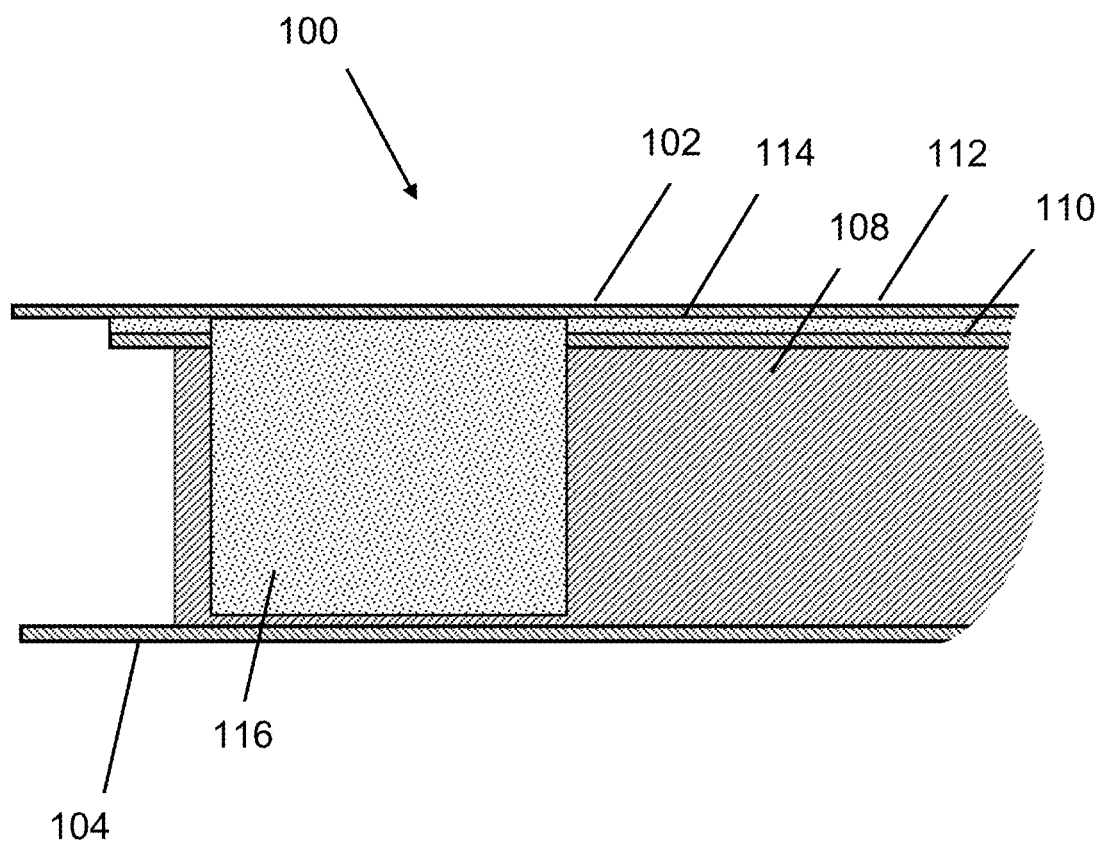
FIG. 3 is a schematic side view of an edge portion of the component of the window unit shown in FIG. 1 as seen in a direction of the arrow in FIG. 2.

FIG. 2 is a side view of a corner portion of the window unit 100 and FIG. 3 is a schematic side view of the window unit 100 as seen in a direction of the arrow in FIG. 2. Like components are given like reference numerals. FIGS. 2 and 3 show the first panel 102 spaced apart from the second panel 104 by a spacer 108. The spacer 108 may for example comprise an aluminium extrusion and surrounds a space between the first panel 102 and the second panel. The first and second panels 102, 104 comprise in this embodiment ultra-low iron glass.

The first panel 102 comprises in this embodiment component panel portions 110 and 112, which are bonded together using polyvinylbutyral (PVB). The solar cells 106 are sandwiched between the component panel portions 110 and 112 and embedded in the PVB lamination material 114.

The first and second component panel portions 110, 112 may be laminated together as follows. Initially a sheet of PVB is positioned between the first component panel portion 110 and the solar cells 106. The PVB sheet is then exposed to heat such that bonding of the solar cells 106 to a first component panel portion 110 is effected. A further sheet of the PVB material is then positioned over the solar cells 106. In addition, further (thicker) PVB sheets are positioned on areas of the first component panel portion 110 at which no solar cells 106 are positioned. The second component panel portion 112 is then bonded to the exposed surfaces of the PVB sheet again by the application of heat such that a laminated structure is formed and the solar cells 106 are sandwiched between the first and second component panel portions 110, 112.

The second component panel portion 112 has in this embodiment a larger circumference than the first component panel portion 110 and the first component panel portion 110 and also the housing 116 are positioned entirely with a projection of the circumference of the second component panel portion 112 in a direction of a surface normal of the second component panel portion 112. In this embodiment the second panel 104 has approximately the same extension as the second component panel portion 112 and a recess is formed between edge portions of the of the first and second component panel 110, 112, the second panel 104 and the spacer 108. The housing 116 is positioned in the formed recess, which is otherwise filled with butyl (not shown) to form a primary seal of the window unit. The window unit 100 consequently has in this embodiment a "flush" edge and the series of solar cells 106 as well as the housing incorporating electrical or electrical components and the electrical connection to the solar cells are protected.

The housing 116 has in this embodiment a height of 10-40 mm, a width of 10-20 mm and is spaced from the spacer 108 by a gap of 1-5 mm. The gap is filled with butyl or the like.

In this embodiment, the series of solar cells 106 comprises bifacial shingled solar cells having active front and rear surfaces. The series of solar 106 have electrical contacts 120 (flat wires) which are directed through the PVB material and then through the butyl material into the housing 116 where the electrical contacts are connected to further electrical components.

Figure 4:
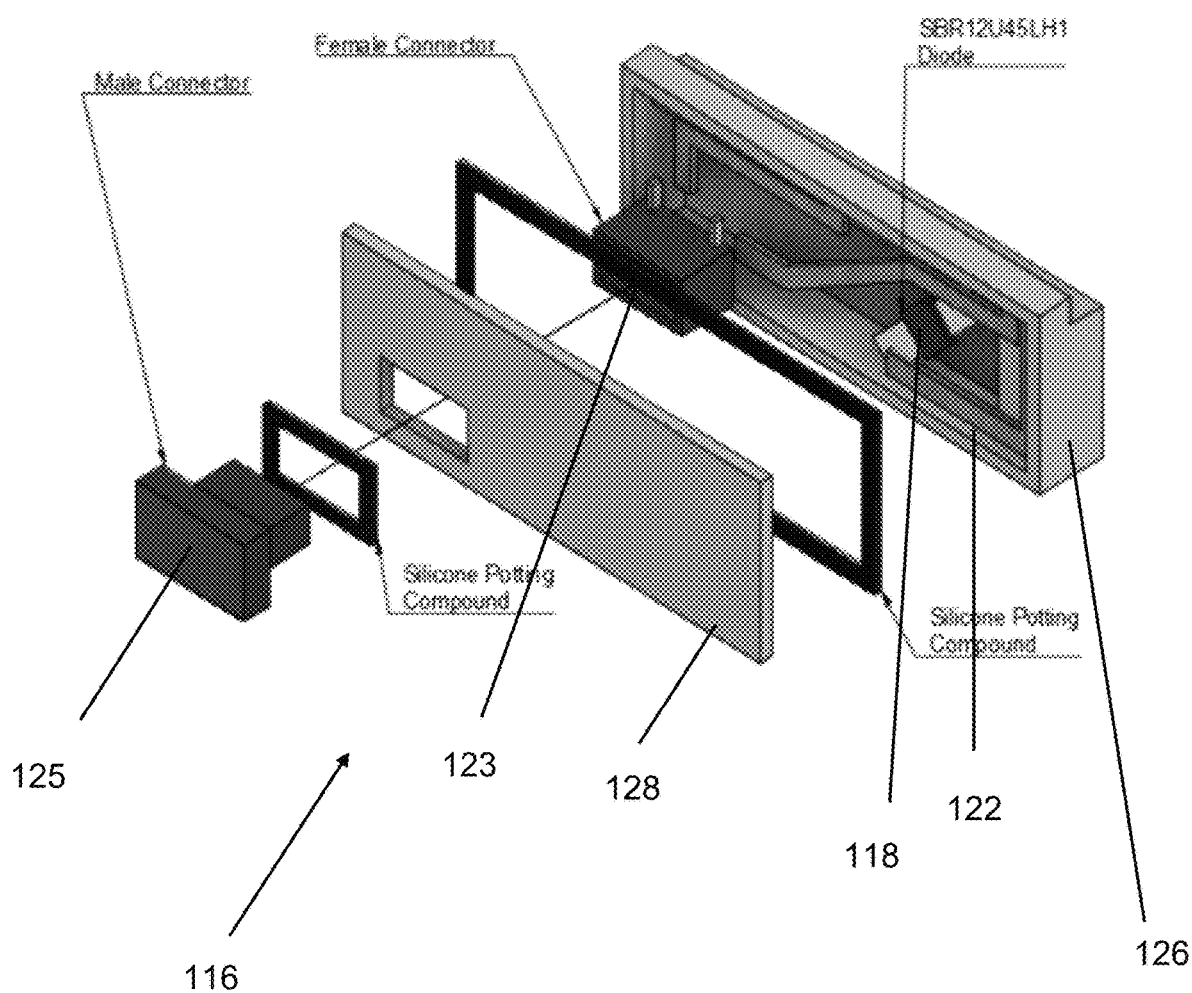
FIG. 4 is an exploded view of components of the window unit in accordance with an embodiment of the present invention.

FIG. 4 is an exploded view of the housing 116 and components incorporated therein. The housing 116 comprises in this embodiment a diode 118, electrical leads 122 and a female electrical coupling 123 arranged for coupling to a male coupling 125 of an external electrical or electronic component. The housing 116 is arranged for coupling to the series of solar cells 106 and the diode 118 is a bypass diode 118. The housing 116 further comprises silicone seals 124. The housing 116 comprises a body 126 with a removeable lid 128 and is formed from a polymetric material.

Ina variation of the described embodiment other electrical or electronic components may be incorporated in the housing 116. For example, the housing 116 may include a battery, a capacitor arrangement for storing electricity generated by the at least one series of solar cells, a battery charge controller, a voltage regulator. Further, the electrical elements incorporated in the housing 116 may comprise control electronics for controlling other electrical components of the window unit. The electrical elements may also comprise electronic components such as a battery charge controller, a voltage regulator and further controller that control a function of the window unit.

A person skilled in the art will appreciate that alternatively embodiments of the present invention may be provided in many different forms. For example, the second component panel portion 112 may not necessarily have a circumference extending beyond the circumference of the first component panel portion 110. Further, the second component panel portion 112 and the second panel 104 may not necessarily have the same extension. In addition, the housing 116 incorporating the electrical and electronic components may not necessarily be positioned entirely with a projection of the circumference of the second component panel portion 112.

The window unit may alternatively comprise any other type of solar cells which may or may not be bifacial solar cells and which may not necessarily be sandwiched between component panel portions. For example, the solar cells may be applied to an inner surface of the first component panel portion 110 or otherwise posited between the first component panel portion 110 and the second panel 104. In addition, the window unit may not comprise any solar cells, but another electrical component may be incorporated into the window unit (such as blinds) which may for example be positioned into a space between the first component panel portion 110 and the second panel 104.

Further, the window unit may also comprise one or more of a suspended particle device, an electrochromic coating, an electro fluidic material, a liquid crystal device, a polymer-dispersed liquid crystal (PDLC) material and an electrophoretic material which may be positioned to regulate a transmissivity of another optical property of the window unit. The housing may incorporate a controller for controlling control such a device or coating.

The invention claimed is:

1. A window unit for a building or structure, the window unit comprising:
 a first panel having an area transparent for at least a portion of visible light, the first panel comprising first and second component panel portions, the first component panel portion having a first major surface which is parallel to a first major surface of the second component panel portion, the first major surface of the second component panel portion having a surface area smaller than an area of the first major surface of the first component panel portion, whereby the first and second component panel portions are arranged such that a projection of the first component panel portion along a surface normal of the first component panel portion extends beyond a circumference of the second component panel portion;
 a second panel having an area transparent for at least a portion of visible light;

at least one series of solar cells positioned between the first and second component panel portions;

a spacer spacing the first panel from the second panel, the spacer surrounding a space between the first and second panels, a first edge area of the first panel extending beyond a projection of the circumference of the spacer in a direction of a surface normal of the first panel;

a housing provided between the first and second panels, the housing incorporating at least one electric or electronic element which is indirectly or directly electrically coupled to at least one other electrical component positioned within the window unit;

wherein the housing is positioned at or near the spacer and at least partially within a projection of the circumference of the first edge area of the first panel in the direction of the surface normal of the first panel; and wherein the first major surface of the second component panel portion faces the spacer, and wherein an electrical lead electrically connecting the at least one series of solar cells to one or more of the at least one electric or electronic element incorporated in the housing is directable around an edge of the second component panel portion.

2. The window unit of claim 1 wherein the housing is positioned entirely within the projection of the first edge area of the first panel in the direction of the surface normal of the first panel, which facilitates use of the window unit as an Insulated Glass Unit (IGU) having standard dimension and installation requirements.

3. The window unit of claim 1 wherein the second panel has substantially the same extension as the first panel and a recess is formed between the first edge area of the first panel, an edge area of the second panel, the spacer and the second panel.

4. The window unit of claim 3 wherein the recess is at least largely filled with butyl to form a primary seal of the window unit.

5. The window unit of claim 4, wherein the housing is positioned at least largely or entirely within the recess and is at least largely embedded in the butyl.

6. The window unit claim 1 comprising the other electrical component.

7. The window unit of claim 1 wherein the electrical element incorporated in the housing comprises at least one of diodes, a battery, a capacitor arrangement, control electronics for controlling electrical components, a battery charge controller and a voltage regulator.

8. The window unit of claim 1 wherein the electrical element comprises, or is provided in the form of, an electric lead.

9. The window unit of claim 1 comprising a first electrical coupling for coupling the other electrical component to the electrical element incorporated within the housing.

10. The window unit of claim 1 comprising a second electrical coupling for coupling the electrical element to at least one other electrical component outside the widow unit.

11. The window unit of claim 1 wherein the first panel comprises first component panel portion and the second component panel portion are bonded together in a manner such that an airgap between the first and second component panel portions is avoided.

12. The window unit of claim 1 comprising at least one of a suspended particle device, an electrochromic coating, an electro fluidic material, a liquid crystal device, a polymer-dispersed liquid crystal (PDLC) material and an electrophoretic material.

13. The window unit of claim 1 wherein the window unit is a self-powered unit that does not necessarily require external wiring.

14. The window unit of claim 1 wherein the at least one series of solar cells comprises bifacial solar cells having opposite first and second surfaces, each having an area in which light can be absorbed to generate electricity, the solar cells being positioned such that in use the first surfaces are oriented to receive light from the light incident direction and the second surfaces receive light from an opposite direction.

15. The window unit of claim 14 wherein the solar cells of the series of solar cells are positioned in an overlapping relationship, such as in a shingle-like arrangement.

16. The window unit of claim 1 wherein the housing is provided in addition to the spacer and wherein the housing is positioned separate from but adjacent to the spacer.

* * * * *